(12) United States Patent
Jun

(10) Patent No.: US 9,183,795 B2
(45) Date of Patent: Nov. 10, 2015

(54) LIQUID CRYSTAL DISPLAY DEVICE

(75) Inventor: Jae-hun Jun, Seoul (KR)

(73) Assignee: LG Display Co., Ltd., Seoul (KR)

( * ) Notice: Subject to any disclaimer, the term of this patent is extended or adjusted under 35 U.S.C. 154(b) by 222 days.

(21) Appl. No.: 12/942,697

(22) Filed: Nov. 9, 2010

(65) Prior Publication Data

US 2011/0157127 A1    Jun. 30, 2011

(30) Foreign Application Priority Data

Dec. 31, 2009 (KR) .................. 10-2009-0135589

(51) Int. Cl.
 *G09G 3/36* (2006.01)
 *H01L 27/118* (2006.01)
 *G09G 3/20* (2006.01)

(52) U.S. Cl.
 CPC ............. *G09G 3/36* (2013.01); *G09G 3/3674* (2013.01); *G09G 3/3685* (2013.01); *G09G 3/20* (2013.01); *G09G 2310/0267* (2013.01); *G09G 2310/0275* (2013.01); *G09G 2330/04* (2013.01); *H01L 27/11898* (2013.01)

(58) Field of Classification Search
 USPC .................. 345/211; 716/8; 257/203; 361/56
 See application file for complete search history.

(56) References Cited

U.S. PATENT DOCUMENTS

| 4,945,395 | A  | * | 7/1990  | Suehiro .......................... 257/203 |
| 5,239,440 | A  | * | 8/1993  | Merrill ............................ 361/56  |
| 7,110,229 | B2 | * | 9/2006  | Yang et al. ...................... 361/56  |
| 7,224,560 | B2 | * | 5/2007  | May et al. ....................... 361/56  |
| 7,283,132 | B2 | * | 10/2007 | Ishibashi et al. ............... 345/212 |
| 7,368,767 | B2 | * | 5/2008  | Kinoshita et al. ............. 257/202 |
| 8,247,845 | B2 | * | 8/2012  | Schroeder et al. ............ 257/203 |
| 2003/0043517 | A1 | * | 3/2003  | Tsuji et al. ...................... 361/56 |
| 2004/0218323 | A1 |   | 11/2004 | Umemoto |
| 2005/0013072 | A1 | * | 1/2005  | Chuang et al. .................. 361/56 |
| 2008/0012797 | A1 |   | 1/2008  | Kil |

(Continued)

FOREIGN PATENT DOCUMENTS

| CN | 101272050 A    | 9/2008  |
| JP | 2004-335504 A  | 11/2004 |
| KR | 10-2008-0001062 A | 1/2008 |

OTHER PUBLICATIONS

Office Action issued in counterpart Chinese Patent Application No. 201010299614.6 dated Aug. 30, 2012.

(Continued)

*Primary Examiner* — Kathy Wang-Hurst
*Assistant Examiner* — Joseph Fox
(74) *Attorney, Agent, or Firm* — Morgan, Lewis & Bockius LLP

(57) ABSTRACT

The present invention relates to a liquid crystal display device which can reduce a chip size and improves an electrostatic discharge capability.

The liquid crystal display device includes a liquid crystal panel for displaying a picture, and a driving circuit unit for driving the liquid crystal panel, wherein the driving circuit unit includes an input/output unit having a plurality of input units for receiving signals from an outside and a plurality of output units for forwarding signals to an outside, a logic unit having a plurality of logical cells each having a plurality of digital logical devices for receiving or forwarding a signal through the input/output unit, and an electrostatic shielding unit for protecting the digital logical devices from an external static electricity, wherein some of elements of the electrostatic shielding unit are formed in spaces among the logical cells.

5 Claims, 4 Drawing Sheets

(56) References Cited

U.S. PATENT DOCUMENTS

| | | |
|---|---|---|
| 2008/0079702 A1 | 4/2008 | Murata |
| 2008/0173899 A1* | 7/2008 | Takakuwa et al. ............ 257/203 |
| 2008/0175045 A1* | 7/2008 | Lin ............................... 365/182 |
| 2008/0310059 A1* | 12/2008 | Wu et al. ......................... 361/56 |
| 2009/0040389 A1 | 2/2009 | Wang |
| 2009/0189194 A1 | 7/2009 | Schroeder et al. |
| 2009/0189640 A1 | 7/2009 | Seto |

OTHER PUBLICATIONS

Office Action dated Feb. 21, 2013 issued in a counterpart Taiwanese Patent Application.

KIPO—Office Action for Korean Patent Application No. 10-2009-0135589—Issued on Sep. 24, 2012—Including English Translation of "Notice of Office Action".

\* cited by examiner

LIQUID CRYSTAL DISPLAY DEVICE

CROSS REFERENCE TO RELATED APPLICATION

This application claims the benefit of the Patent Korean Application No. 10-2009-0135589, filed on Dec. 31, 2009, which are hereby incorporated by reference as if fully set forth herein.

BACKGROUND OF THE DISCLOSURE

1. Field of the Disclosure

The present invention relates to liquid crystal display devices, and more particularly, to a liquid crystal display device which has a driving circuit for reducing a chip size and improving an electrostatic discharge capability.

2. Discussion of the Related Art

The electrostatic discharge capability of an electrostatic shielding unit depends on a size of an electrostatic discharge transistor. The greater the size of the electrostatic discharge transistor, the higher a rate of electrostatic discharge. However, it is difficult to increase the size of the electrostatic discharge transistor within a limited core area. Consequently, in the related art, the poor electrostatic discharge capability of the electrostatic discharge unit causes to fail to discharge high voltage static electricity within a short time period.

SUMMARY OF THE DISCLOSURE

Accordingly, the present invention is directed to a liquid crystal display device.

An object of the present invention is to provide a liquid crystal display device in which a plurality of electrostatic discharge transistors connected to one another are formed at dummy areas of a logic unit for reducing a chip size, and improving electrostatic discharge capability, of a driving circuit unit, significantly.

Additional advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a liquid crystal display device includes a liquid crystal panel for displaying a picture, and a driving circuit unit for driving the liquid crystal panel, wherein the driving circuit unit includes an input/output unit having a plurality of input units for receiving signals from an outside and a plurality of output units for forwarding signals to an outside, a logic unit having a plurality of logical cells each having a plurality of digital logical devices for receiving or forwarding a signal through the input/output unit, and an electrostatic shielding unit for protecting the digital logical devices from an external static electricity, wherein some of elements of the electrostatic shielding unit are formed in spaces among the logical cells.

The electrostatic shielding unit includes an electrostatic sensing unit for sensing introduction of static electricity thereto, and an electrostatic discharge unit for discharging the voltage introduced through the power supply line to a ground terminal depending on a result of sensing by the electrostatic sensing unit.

The electrostatic discharge unit includes a plurality of electrostatic discharge transistors connected in parallel to one another, wherein at least one of the electrostatic discharge transistors is formed in the space among the logical cells.

The electrostatic discharge transistors are connected in parallel between the power supply line and the ground terminal.

Gate electrodes of the electrostatic discharge transistors are connected to the electrostatic sensing unit, drain electrodes of the electrostatic discharge transistors are connected to the power supply line, and source electrodes of the electrostatic discharge transistors are connected to the ground terminal.

The electrostatic sensing unit includes a resistor connected between the power supply line and a node, a capacitor connected between the node and the ground terminal, and an inverter connected between the node and the gate electrode of the electrostatic discharge transistor.

The driving circuit unit is data drive ICs for supplying pixel voltage to data lines in the liquid crystal display device.

The driving circuit unit is the timing controller for controlling operation of the data drive ICs for supplying the pixel voltages to data lines in the liquid crystal display device.

The logic unit and the electrostatic shielding unit are formed at the core area surrounded by the input/output units.

The spaces among the logical cells are dummy areas for placing dummy cells therein for adjusting a pattern density of the logic unit, and some of the elements of the electrostatic shielding unit are formed in the dummy areas instead of the dummy cells.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DESCRIPTION OF SPECIFIC EMBODIMENTS

Reference will now be made in detail to the specific embodiments of the present invention, examples of which are illustrated in the accompanying drawings. Wherever possible, the same reference numbers will be used throughout the drawings to refer to the same or like parts.

Figure 1:
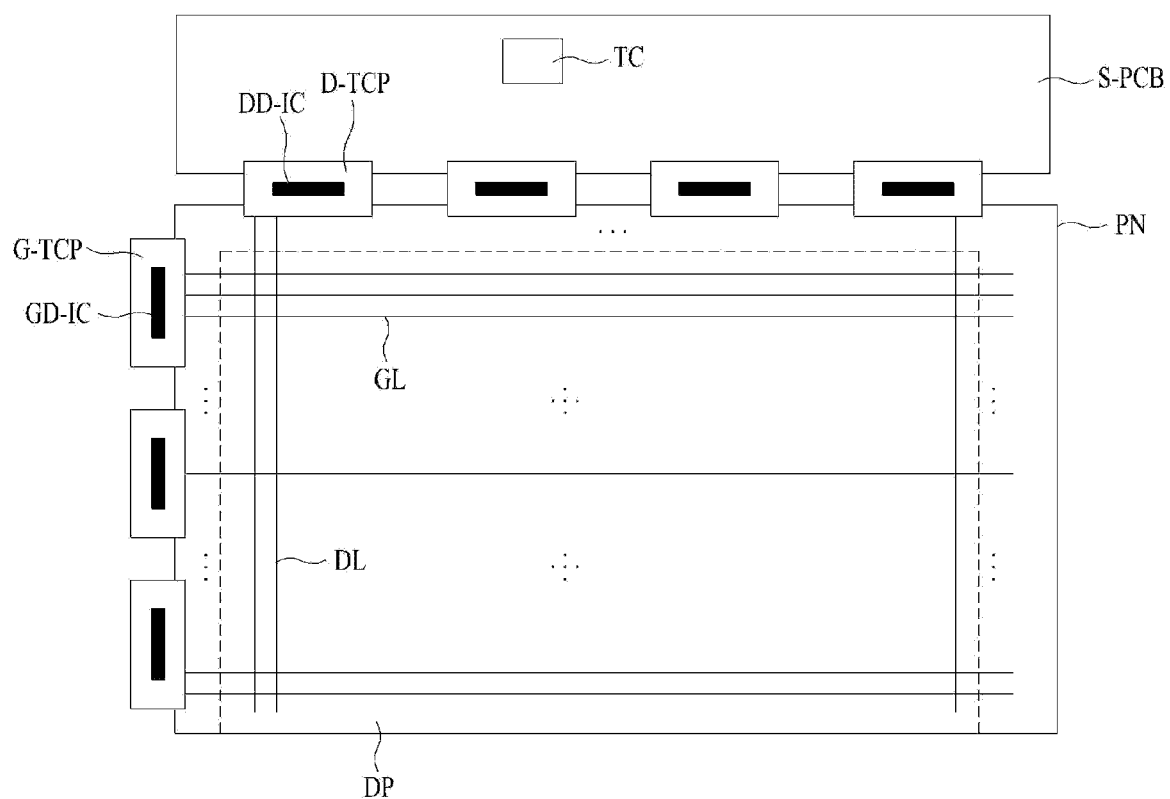
FIG. 1 illustrates a diagram of liquid crystal display device in accordance with a preferred embodiment of the present invention.

FIG. 1 illustrates a diagram of liquid crystal display device in accordance with a preferred embodiment of the present invention.

Referring to FIG. 1, the liquid crystal display device includes a liquid crystal panel PN for displaying a picture, a plurality of gate drive ICs GD-IC connected both to one side of the liquid crystal panel PN with a gate tape carrier package G-TCP and to one side ends of gate lines of the liquid crystal panel PN, a timing controller TC for generating various control signals required for driving gate drive ICs GD-IC and data driving ICs DD-IC, a source printed circuit board S-PCB having the timing controller mounted thereto, and a plurality of data driver ICs DD-IC for supplying pixel voltages to the data lines DL on the liquid crystal panel PN.

The liquid crystal panel PN includes a display portion DP having a plurality of pixels formed thereon, and a non-display portion formed around the display portion DP.

In this instance, each of the data driver ICs DD-IC is mounted to the gate tape carrier package G-TCP, and the gate tape carrier package G-TCP connects the liquid crystal panel PN to the source printed circuit board S-PCB.

The timing controller TC generates a data control signal by using a horizontal synchronizing signal, a vertical synchronizing signal, and a clock signal received from a system, and supplies the data control signal to the data driver ICs DD-IC and the gate drive ICs GD-IC. The data signal includes a dot clock, a source shift clock, a source enable signal, a polarity inversion signal, and so on.

The timing controller TC, the gate drive ICs GD-IC and the data driver ICs DD-IC being driving circuit units for driving the liquid crystal panel PN, have the following configurations.

Figure 2:
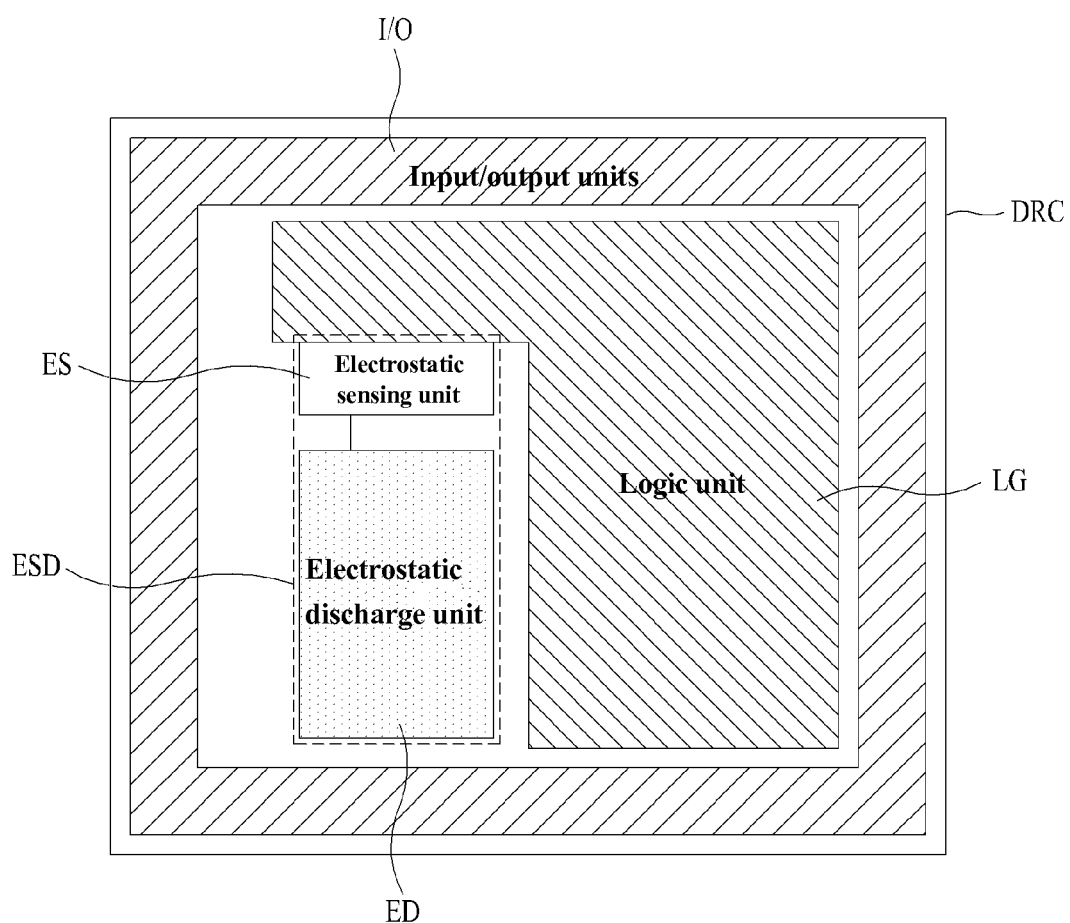
FIG. 2 illustrates a diagram of a driving circuit unit in detail.

FIG. 2 illustrates a diagram of a driving circuit unit in detail.

Referring to FIG. 2, the driving circuit unit DRC includes an input/output unit I/O, a logic unit LG, and an electrostatic shielding unit ESD. The logic unit LG and the electrostatic shielding unit ESD are formed at a core area surrounded by the input/output unit I/O.

The input/output unit I/O includes a plurality of input units for receiving signals from an outside and a plurality of output units for forwarding signals to an outside.

The logic unit LG includes a plurality of logical cells each having a plurality of digital logical devices for receiving or forwarding a signal through the input/output unit I/O.

The electrostatic shielding unit ESD serves to protect the digital logical devices from an external static electricity.

In this instance, some of elements of the electrostatic shielding unit ESD are formed in spaces among the logical cells. The spaces among the logical cells are dummy areas for placing dummy cells therein for adjusting a pattern density of the logic unit LG, respectively. In the present invention, some of the elements of the electrostatic shielding unit ESD are formed in the dummy areas. That is, in the present invention, instead of the dummy cells, some of the elements of the electrostatic shielding unit ESD are formed at the dummy area for adjusting a pattern density of the logic unit, and reducing a size of the core area to reduce a size of the driving circuit unit DRC, at the end.

Referring to FIG. 2, the electrostatic shielding unit ESD includes an electrostatic sensing unit ES and an electrostatic discharge unit ED. The electrostatic sensing unit ES senses introduction of static electricity from an outside, and the electrostatic discharge unit ED discharges the static electricity introduced thereto through a power supply line to a ground terminal. That is, the electrostatic sensing unit ES senses magnitude of a voltage introduced thereto through the power supply line and determines whether the voltage is a normal voltage or an abnormal voltage caused by introduction of static electricity thereto. As a result of sensing by the electrostatic sensing unit ES, if the voltage of the power supply line is determined normal, the electrostatic discharge unit ED does not come into operation. Accordingly, the voltage of the power supply line is supplied to the logic unit LG. Opposite to this, as the result of sensing by the electrostatic sensing unit ES, if the voltage of the power supply line is determined abnormal, the electrostatic discharge unit ED discharges the voltage of the power supply line to the ground terminal so that the voltage of the power supply line is not supplied to the logic unit LG.

Figure 3:
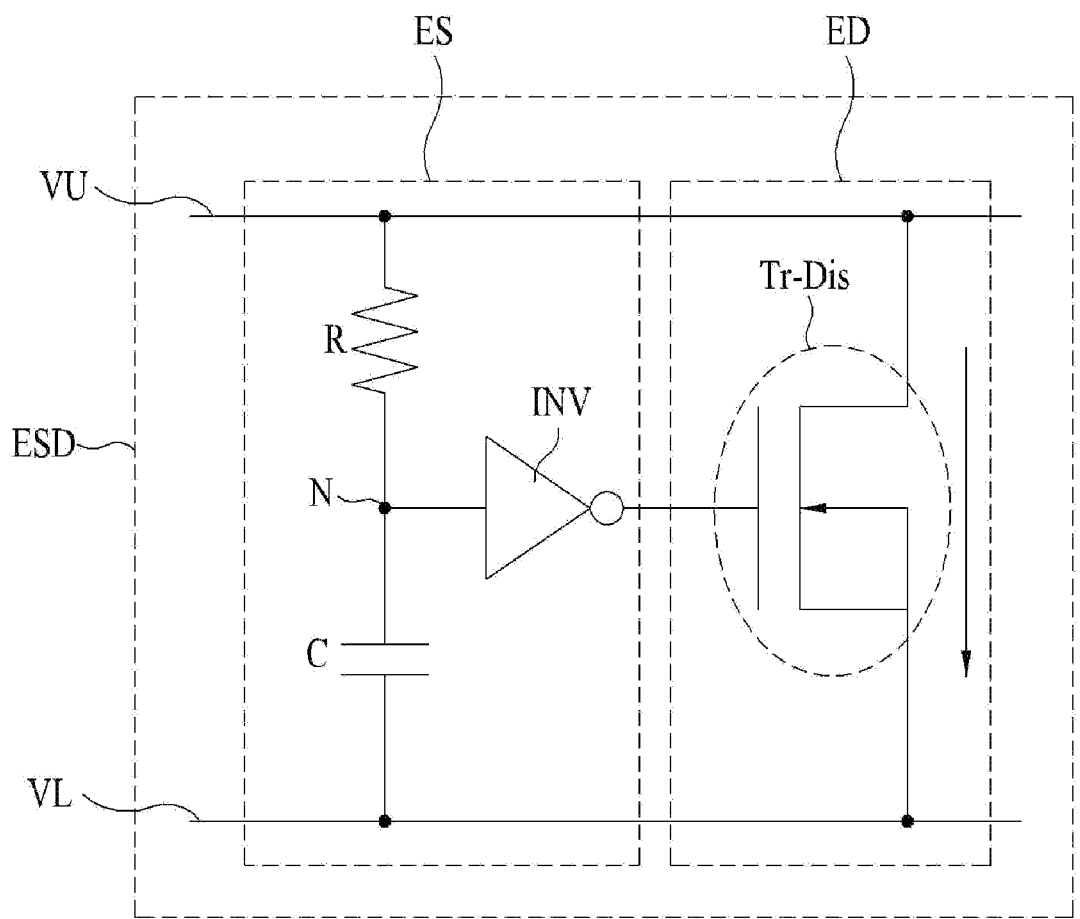
FIG. 3 illustrates a diagram of an electrostatic shielding unit in detail.

FIG. 3 illustrates a diagram of an electrostatic shielding unit ESD in detail.

As described, the electrostatic shielding unit ESD includes the electrostatic sensing unit ES and the electrostatic discharge unit ED, wherein the electrostatic sensing unit ES includes a resistor R, a capacitor C and an inverter INV, and the electrostatic shielding unit ESD includes at least one electrostatic discharge transistor Tr_Dis.

The resistor R is connected between the power supply line VU and a node N, and the capacitor C is connected between the node N and the ground terminal VL, and the inverter INV is connected between the node N and a gate electrode of the electrostatic discharge transistor Tr_Dis.

If the voltage of the power supply line VU is normal, since the voltage of the node N rises slowly by time constants of the resistor R and the capacitor C, the inverter INV connected to the node N forwards 0, making the electrostatic discharge transistor Tr_Dis to keep a turned off state. According to this, the voltage of the power supply line VU is supplied to the logic unit, normally.

Opposite to this, if the static electricity is introduced to the power supply line VU, increasing the voltage of the power supply line VU within a short time period significantly, the voltage at the node N also changes, sharply. Then, the inverter INV forwards 1 in response to the voltage at the node N, to turn on the electrostatic discharge transistor Tr_Dis, accordingly. Then, the electrostatic discharge transistor Tr_Dis turned on thus forms a current path between the power supply line VU and the ground terminal VL, through which the voltage is discharged from the power supply line VU to the ground terminal VL through the current path.

The electrostatic discharge capability of the electrostatic shielding unit ESD depends on the electrostatic discharge transistor Tr_Dis, substantially. The greater the size of the electrostatic discharge transistor Tr_Dis, the faster the discharge of the static electricity. However, it is difficult to increase the size of the electrostatic discharge transistor Tr_Dis within the limited core area. To solve this problem, the present invention utilizes the dummy areas formed at the logic unit LG.

Figure 4:
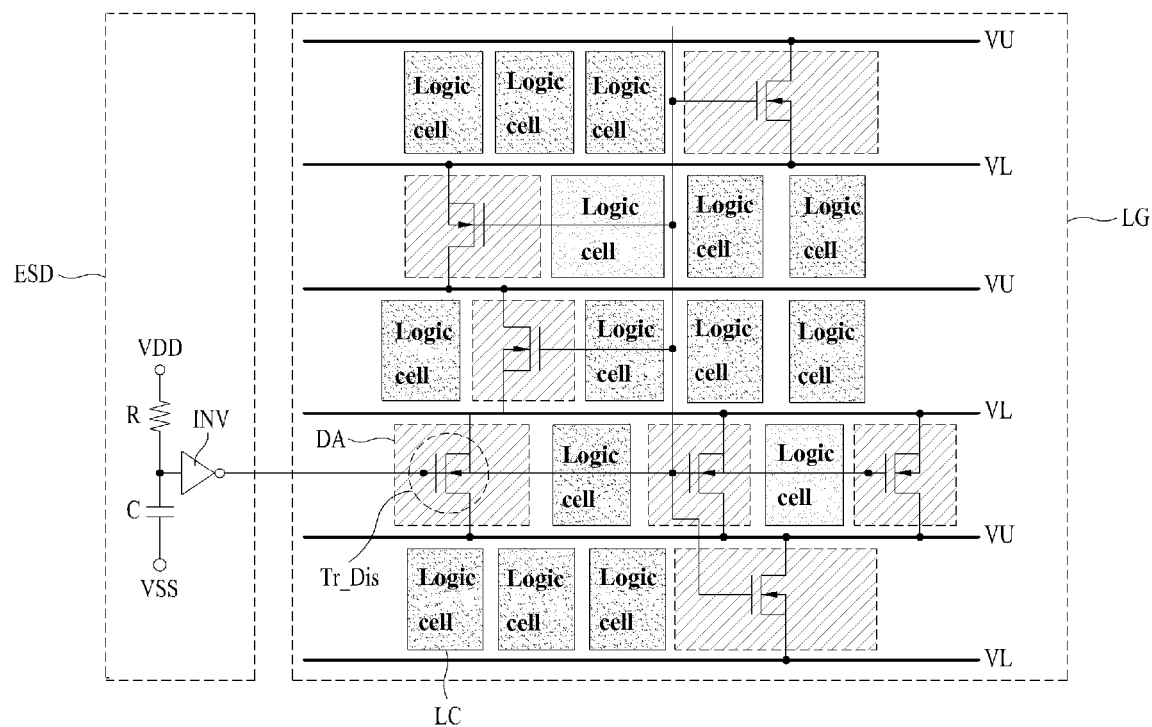
FIG. 4 illustrates a diagram of a logic unit in accordance with a preferred embodiment of the present invention.

FIG. 4 illustrates a diagram of a logic unit LG in accordance with a preferred embodiment of the present invention.

Referring to FIG. 4, the logic unit LG includes a plurality of logical cells LC and the dummy areas DA. In the present invention, a plurality of the electrostatic discharge transistors Tr_Dis are formed at the dummy areas DA. In this instance, the sizes of the electrostatic discharge transistors Tr_Dis may vary with the sizes of the dummy areas DA.

The electrostatic discharge transistors Tr_Dis at respective the dummy areas DA are connected in parallel to one another. That is, the electrostatic discharge transistors Tr_Dis are connected in parallel between the power supply line VU and the ground terminal VL. In detail, gate electrodes of the electrostatic discharge transistors Tr_Dis are connected to an output terminal of the inverter INV in common, drain electrodes of the electrostatic discharge transistors Tr_Dis are connected to the power supply line VU in common, and source electrodes of the electrostatic discharge transistors Tr_Dis are connected to the ground terminal VL in common.

A power source voltage VDD is supplied to the power supply line VU, and a ground terminal voltage VSS is supplied to the ground terminal VL. The ground terminal voltage VSS may be 0[V].

Thus, the present invention can reduce a size of the core area by forming electrostatic discharge transistors Tr_Dis at the dummy areas DA in the logic unit LG, and can improve the electrostatic discharge capability of the electrostatic discharge unit ED of the electrostatic discharge transistors Tr_Dis by connecting the plurality of electrostatic discharge transistors Tr_Dis to one another substantially, at the end.

The driving circuit unit DRC of the present invention can be the timing controller TC, at least one of the gate drive ICs GD-IC or at least one of the data drive ICs, wherein by applying a structure described above to the timing controller including relatively many digital logic devices, the size of a chip of the driving circuit unit can be reduced and the electrostatic discharge capability can be improved, substantially.

As has been described, the liquid crystal display device of the present invention has the following advantages.

The formation of the plurality of the electrostatic discharge transistors at the dummy areas in the logic unit permits to reduce a size of the core area, and the connection of the plurality of the electrostatic discharge transistors to one another improves the electrostatic discharge capability of the electrostatic shielding unit of the electrostatic discharge transistors, at the end.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A liquid crystal display device, comprising:
    a liquid crystal panel displaying a picture; and
    a driving circuit unit driving the liquid crystal panel,
    wherein the driving circuit unit comprises:
        an input/output unit comprising a plurality of input units receiving signals from an outside and a plurality of output units forwarding signals to the outside,
        a logic unit having a plurality of logical cells each comprising a plurality of digital logical devices receiving or forwarding a signal through the input/output unit, and
        an electrostatic shielding unit protecting the digital logical devices from an external static electricity,
            wherein the electrostatic shielding unit comprises:
                an electrostatic sensing unit sensing introduction of static electricity thereto, and
                a plurality of electrostatic discharge transistors connected in parallel to one another,
    wherein the plurality of electrostatic discharge transistors excluding the electrostatic sensing unit are respectively positioned in dummy areas as spaces among the logical cells, the dummy areas adjusting a pattern density of the logic unit and the sizes of the electrostatic discharge transistors being respectively varied with the sizes of the dummy areas,
    wherein a plurality of the dummy areas being respectively disposed in between adjacent logical cells which are positioned in a row,
    wherein a first row and a second row of the electrostatic discharge transistors share a ground line between the first and second rows, and the second row and a third row of the electrostatic discharge transistors share a power supply line between the second and third rows, the electrostatic discharge transistors being connected in parallel between the power supply line and the ground line, and
    wherein the electrostatic sensing unit comprises:
        a resistor connected between the power supply line and a node,
        a capacitor connected between the node and the ground line, and
        an inverter connected between the node and the gate electrodes of the electrostatic discharge transistors,
        wherein the gate electrodes of the electrostatic discharge transistors are commonly connected to an output terminal of the inverter only through connection lines and contact nodes between the gate electrodes and the output terminal, and
        wherein the gate electrodes of all of the electrostatic discharge transistors are directly connected together.

2. The liquid crystal display device as claimed in claim 1, wherein the driving circuit unit is data drive ICs (integrated circuits) for supplying pixel voltage to data lines in the liquid crystal display device.

3. The liquid crystal display device as claimed in claim 1, wherein the driving circuit unit is a timing controller for controlling operation of data drive ICs (integrated circuits) for supplying pixel voltages to data lines in the liquid crystal display device.

4. The liquid crystal display device as claimed in claim 1, wherein the logic unit and the electrostatic shielding unit are formed at a core area surrounded by the input/output units.

5. The liquid crystal display device as claimed in claim 1, wherein:
    gate electrodes of the electrostatic discharge transistors are connected to the electrostatic sensing unit;
    drain electrodes of the electrostatic discharge transistors are directly physically connected to the power supply line; and
    source electrodes of the electrostatic discharge transistors are directly physically connected to the ground terminal.

* * * * *